(12) United States Patent
Branz

(10) Patent No.: US 6,713,400 B1
(45) Date of Patent: Mar. 30, 2004

(54) METHOD FOR IMPROVING THE STABILITY OF AMORPHOUS SILICON

(75) Inventor: Howard M. Branz, Boulder, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 09/714,331

(22) Filed: Nov. 16, 2000

Related U.S. Application Data

(60) Provisional application No. 60/165,751, filed on Nov. 16, 1999.

(51) Int. Cl.⁷ .................. H01L 21/302; H01L 21/3065
(52) U.S. Cl. .................. 438/706; 438/710; 438/712; 438/745; 428/391; 428/446; 428/698
(58) Field of Search ............... 438/706, 710, 438/712, 745; 428/391, 446, 698

(56) References Cited

U.S. PATENT DOCUMENTS

| | | | | |
|---|---|---|---|---|
| 4,581,099 A | * | 4/1986 | Fukaya et al. | 156/643 |
| 4,624,737 A | * | 11/1986 | Shimbo | 156/643 |
| 4,668,599 A | * | 5/1987 | Yamazaki et al. | 430/84 |
| 4,761,302 A | * | 8/1988 | Weil | 427/578 |
| 4,960,675 A | * | 10/1990 | Tsuo et al. | 430/311 |
| 5,034,795 A | * | 7/1991 | Henry | 257/431 |
| 5,041,361 A | * | 8/1991 | Tsuo | 430/311 |
| 5,166,757 A | * | 11/1992 | Kitmura et al. | 257/53 |
| 5,214,002 A | * | 5/1993 | Hayashi et al. | 438/96 |
| 5,730,808 A | * | 3/1998 | Yang et al. | 136/249 |
| 5,759,745 A | * | 6/1998 | Hollingsworth | 430/313 |
| 5,946,561 A | * | 8/1999 | Yamazaki et al. | 438/166 |

OTHER PUBLICATIONS

Howard Branz, Hydrogen Collision Model of Light–induced Metastability in Hydrogenated Amorphous Silicon, Solid State Communications, 1998, pp. 387–391, vol. 105, No. 6, United States of America.

* cited by examiner

Primary Examiner—Nadine G. Norton
Assistant Examiner—Lynette T. Umez-Eronini
(74) Attorney, Agent, or Firm—Paul J. White

(57) ABSTRACT

A method of producing a metastable degradation resistant amorphous hydrogenated silicon film is provided, which comprises the steps of growing a hydrogenated amorphous silicon film, the film having an exposed surface, illuminating the surface using an essentially blue or ultraviolet light to form high densities of a light induced defect near the surface, and etching the surface to remove the defect.

15 Claims, 3 Drawing Sheets

METHOD FOR IMPROVING THE STABILITY OF AMORPHOUS SILICON

CROSS REFERENCE TO RELATED APPLICATIONS

Pursuant to 35 U.S.C 119(e) Applicant claims the benefit of U.S. Ser. No. 60/165,751 filed Nov. 16, 1999, a 35 U.S.C. 111(b) Application.

CONTRACTUAL ORIGIN OF THE INVENTION

The United States Government has rights in this invention pursuant to Contract No. DE-AC36-99GO10337 between the United States Department of Energy and the Midwest Research Institute.

BACKGROUND OF THE INVENTION

1. Field of the Invention

This invention relates to hydrogenated amorphous silicon materials, and, in particular, it relates to a method of making hydrogenated amorphous silicon films which are characterized by an improved stability to metastable degradation and useful in amorphous silicon devices.

2. Description of the Related Art

An amorphous silicon device, such as a silicon solar cell, is comprised of a body of hydrogenated amorphous silicon (a-Si:H) material, which can be formed in a glow discharge of silane or other chemical vapor deposition techniques. Such cells can be of the type described in U.S. Pat. No. 4,064,521 entitled: Semiconductor Device Having a Body of Amorphous Silicon, issued to D. E. Carlson on Dec. 20, 1977. Amorphous hydrogenated silicon based device technology is currently the leading candidate for large area, low-cost photovoltaic applications.

For solar cells, the basic device structure is a single p-i-n junction or an n-i-p junction in which all layers are traditionally amorphous and are made in a continuous plasma deposition process. The substrate of the solar cell can be made of glass or a metal, such as aluminum, niobium, titanium, chromium, iron, bismuth, antimony or steel. A metallic contact can be formed on the back of the substrate.

However, since its discovery in 1977, a distinct disadvantage in application of these materials in devices has heretofore been the problem of light-induced metastability of the a-Si:H films themselves. See, Staebler, D. L. and Wronski, C. R., Appl. Phys,. Lett., 31, 1977, 292. Briefly, the exposure of device-quality a-Si:H films to light or excess carriers results in an increase in the density of neutral threefold-coordinated dangling-bond (DB) defects by one to two orders of magnitude. The excess in defects reduces carrier lifetimes and photoconductivity in the films which sharply limits the usefulness of a-Si:H as an inexpensive semiconductor material.

A new model of light-induced metastability (Staebler-Wronski effect) in a-Si:H has more recently been disclosed. There, it is postulated that when two mobile H atoms, generated by photo-induced carriers, collide they form a metastable-immobile-complex which contains two Si—H bonds. Excess metastable dangling bonds remain at the uncorrelated sites, from which the colliding hydrogen molecules were excited. This quantitative model accounts for many of the experimental observations which relate to the microscopic nature of the degradation problem and the associated kinetics of light-induced-defect-creation under various conditions. See Branz, H., Solid State Communications, Vol. 105, No. 6, pp. 387–391, 1998.

It is well known that the light-induced DB defects are metastable because they can be reversed. In the prior art, one method of reversing metastability includes annealing the films for 2 hours at temperatures greater than 150° C. Another way of annealing light-induced changes in the dark conductivity and photoconductivity of a-Si:H thin films involves the ultraviolet (UV) irradiation (wavelength≅254 nm) of the films at room temperature. With this annealing process, a problem exists in that although the bulk photoconductivity of the film is improved, the UV irradiation is mostly absorbed near the top surface of the films and causes considerable surface damage. G. Ganguly, et al., Appl. Phys. Lett. 55, 1975 (1989). Further, illumination will cause Staebler-Wronski degradation of all amorphous silicon after such reversal treatments. Thus, what is needed is a process which, unlike the foregoing reversal methods, produces device-quality a-Si:H films which are highly resistant to metastable degradation without deleterious surface damage and thereby demonstrate an improvement in stability under light exposure or excess carrier conditions when used in amorphous silicon devices.

SUMMARY OF THE INVENTION

It is accordingly an object of the invention to provide novel hydrogenated amorphous silicon films which are characterized by an improved resistance to metastable degradation.

It is another object of the invention to provide a novel method for producing device-quality a-Si:H films which are highly resistant to metastable degradation and thereby demonstrate an improved stability when exposed to light or excess carriers.

It is yet another object of the invention to provide amorphous silicon devices which, through use of the novel a-Si:H films made according the method herein, are characterized by an improvement in stability when used under light or excess carrier conditions.

Briefly, to overcome the problems associated with the prior art methods and in accordance with the purpose of the invention, as embodied and broadly described herein, the invention is intended to provide a method of producing amorphous hydrogenated silicon films which are resistant to metastable degradation, the method comprising the steps of growing a hydrogenated amorphous silicon film, the film having an exposed surface, illuminating the surface using an essentially blue or ultraviolet light to form high densities of a light induced defect near the surface, and etching the surface to remove the defect.

Additional advantages of the present invention will be set forth in part in the Id description that follows and in part will be obvious from that description or can be learned from practice of the invention. The advantages of the invention can be realized and obtained by the method particularly pointed out in the appended claims.

DESCRIPTION OF THE DRAWINGS

The accompanying drawings, which are incorporated in and which constitute a part of the specification, illustrate at least one embodiment of the invention and, together with the description, explain the principles of the invention.

DESCRIPTION OF THE PREFERRED EMBODIMENTS

Unless specifically defined otherwise, all technical or scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

Figure 1:
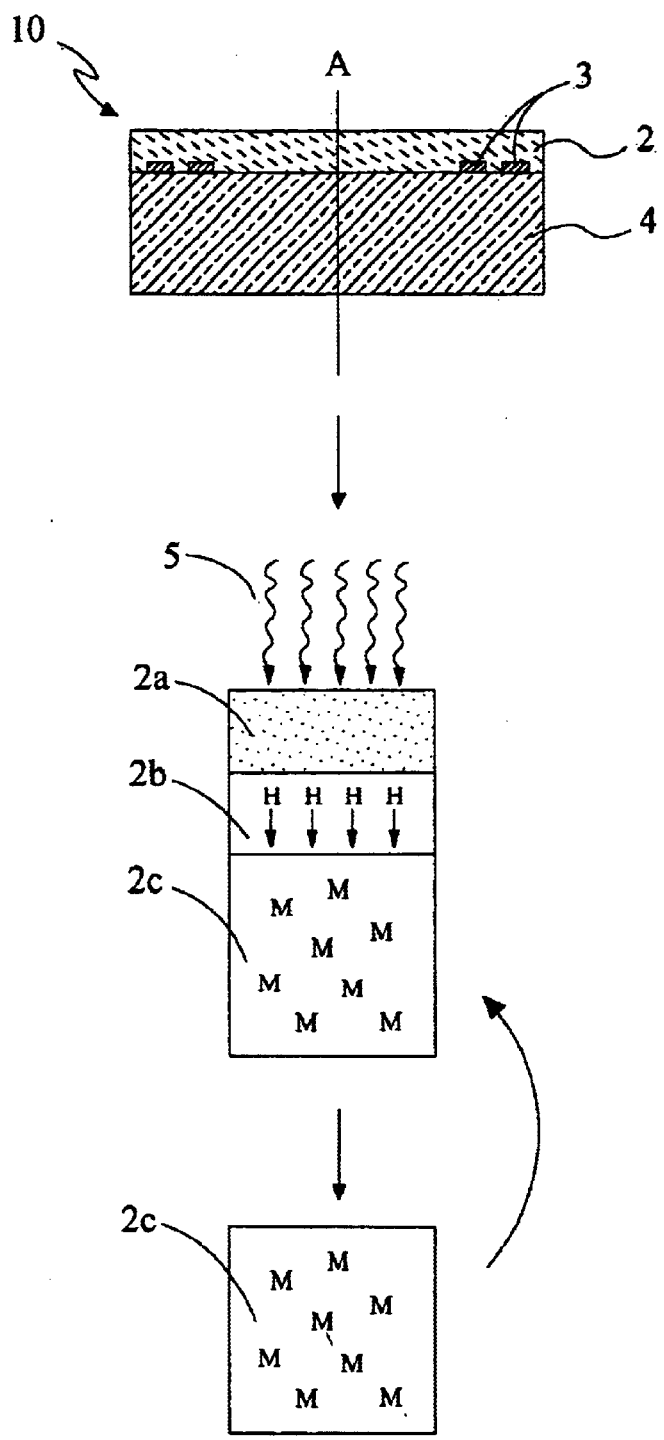
FIG. 1 is a flow diagram of the process according to the invention.

The invention provides a process for improving a-Si:H stability by increasing the density of metastable two-hydrogen complexes without simultaneously increasing the dangling-bond density. Referring now to the drawing figures, in FIG. 1 it is shown generally at 10 a device comprised of an a-Si:H film 2 deposited on a suitable substrate 4, such as glass. The film 2 may be incorporated into a solar cell, transistor, sensor or any other device utilizing a-Si:H or it may be an alloy based on a-Si:H, such as a-SiGe:H or a-SiC:H. The device 10 may be prepared according to any method well known in the art. For example, a-Si:H devices 10 may be prepared by the glow discharge decomposition of 10 sccm of pure silane at a chamber pressure of 0.3 Torr with radio frequency power of 5 W (13.56 MHz frequency) onto substrates 4 held at 250° C. Metal contacts 3 are also provided for measurement of photoconductivity.

An excess metastable (M(Si—H)$_2$) region 2c is created using illumination of the a-Si:H film layer 2 with blue or ultraviolet light 5, as shown through cross section A of the device 10. The illumination step increases the dangling-bond density in damaged region 2a, but, at the same time, gently drives excess mobile hydrogen 2b into the bulk of the film 2 where it passivates dangling-bonds and forms the two-hydrogen complexes M (Si—H)$_2$ in the bulk region 2c. An etching step is then used to remove the damaged surface layer 2a, leaving behind a hydrogen-enriched film 2c. The illumination and etch steps may be repeated many times, and can be done either in a deposition chamber or outside it after deposition of the film 2 itself.

In some applications the film must be carefully handled subsequent to the ultraviolet light illumination processing step. For example, annealing for about 1 hour at 200° C. or more will cause hydrogen to redistribute within the film, and this redistribution of hydrogen will annul the improvements achieved with the ultraviolet-light-illumination and etch steps, according to the method of the invention. Moreover, when using the film in device applications, thermal treatment of the doped contacts or other layers subsequent to the illumination and etch steps is desirably limited to temperatures in a range of less than 150° C.

Referring again to FIG. 1, when a film prepared according to the method of the present invention is used under illumination conditions, mobile hydrogen 2c is released from the metastable two-hydrogen complexes, and this release stabilizes the material against excessive metastable dangling bond formation (Staebler-Wronski effect).

The following examples illustrate the manner in which the amorphous hydrogenated silicon materials in accordance with the method of the present invention can be made and used in device quality applications.

EXAMPLE 1

Referring once again to FIG. 1 a device 10 having an a-Si:H layer 2 approximately 4800 Å in depth was cut in half along cross section A. One half of the sample was illuminated for 40 minutes with about 38 mW/cm$^{-2}$ of UV light obtained from a Hg—Xe compact arc lamp light source filtered through a 335 nm filter with a 100 nm wide band pass. The other half of the sample was used as the control without illumination. Each half was then etched in a 20% solution of NaOH in water for about 3 minutes in order to remove the upper 700 Å of the surface, leaving an a-Si:H layer(s) 2c of approximately 4100 Å. The layers 2c were illuminated continuously by 100 mW/cm$^{-2}$ of red light from a white source filtered by a 650 nm filter with a 100 nm wide bandpass. Periodic photoconductivity measurements were made under this same red light.

Figure 2:
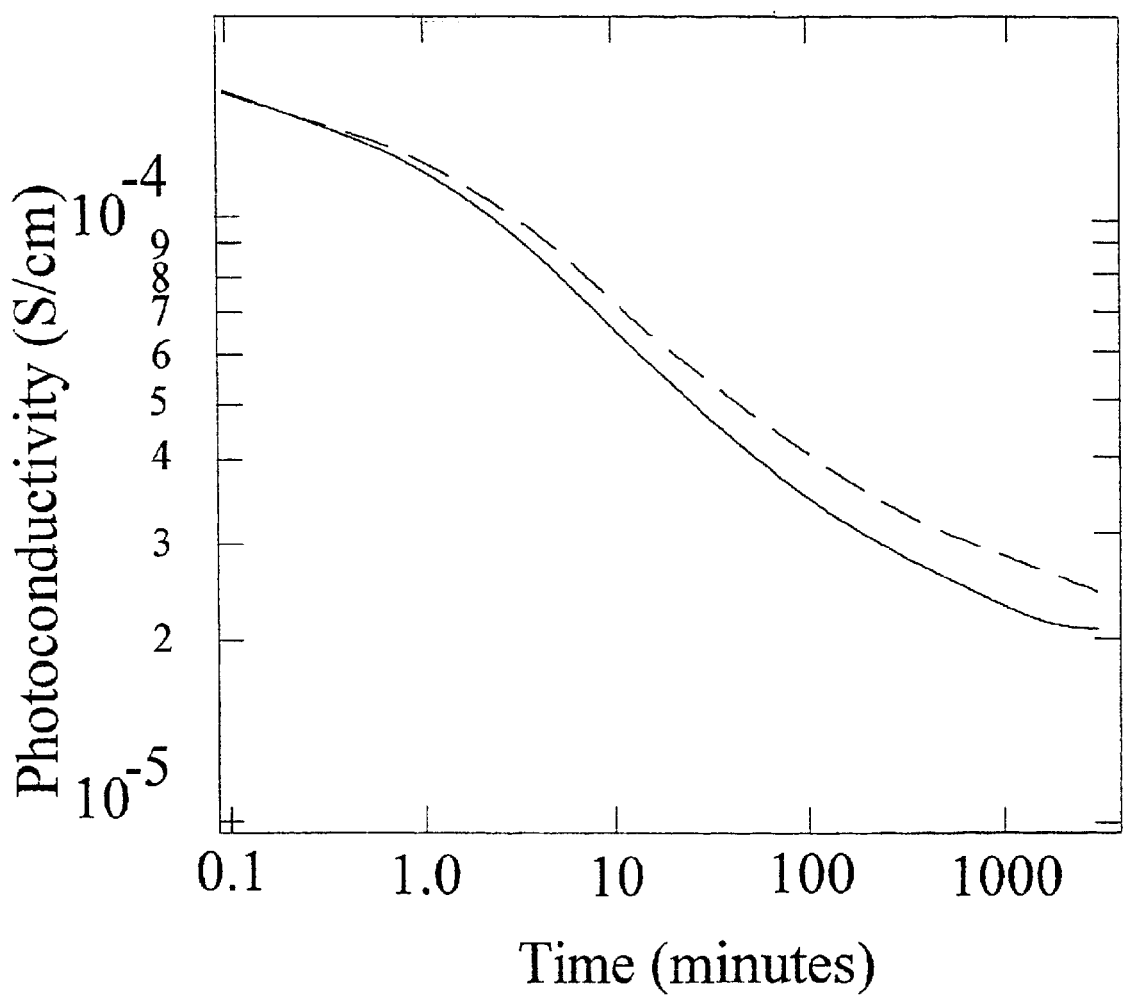
FIG. 2 is a graph showing an improvement in the stability of an a-Si:H film prepared using the process of the invention.

FIG. 2, the photoconductivity (S/cm) for each of the above samples is graphically illustrated as a function of time. The dashed line represents the measured results for the UV illuminated sample, and the solid line represents the control results. From this graph, it is easily observed that the UV illuminated and etched sample was more stable over time.

EXAMPLE 2

Figure 3:
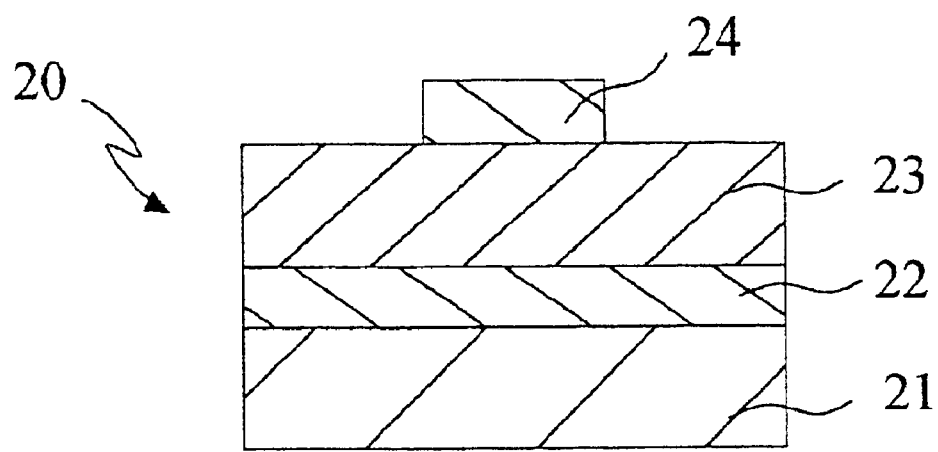
FIG. 3 is a schematic diagram of a Schottky barrier photovoltaic cell having an amorphous hydrogenated silicon material made according to the method herein and deposited on a stainless steel substrate in accordance with Example 2.

This example illustrates an improved resistance, measured as the function of open-circuit voltage, to metastable degradation under light-soaking conditions using Schottky barrier photovoltaic cells. Referring now to FIG. 3, it is shown generally a schematic diagram of the Schottky cell 20 as deposited on a stainless steel substrate 21. Here, a 500 Å thick n-layer 22 was deposited using plasma-enhanced chemical vapor deposition (PECVD) from PH$_3$, H$_2$ and SiH$_4$ source gasses. A 3000 Å thick i-layer 23 was also PECVD deposited from a SiH$_4$ source gas. A portion of this thin film 23 was then treated with ultraviolet light for 1 hour using the light source and intensity conditions set forth above. Then, an overlapping portion of the sample surface was etched in a 20% solution of NaOH in water for about 1 minute to remove about 700 Å from the top i-layer 23 surface. A portion of the sample which was not etched had been treated with ultraviolet light in order to serve as an experimental control. Semitransparent Pd top-contacts 24, having a thickness of about 140 Å, were then deposited on all regions of the film to complete the Schottky photovoltaic devices 20 of FIG. 3.

Many of the devices 20 were then measured, before and after a 3 day of light soaking condition, with about 100 mW/cm of white light from a multi-vapor metal-halide lamp source. After deposition, all devices which had not been exposed to the ultraviolet light illumination step had an open-circuit voltage of 0.48 to 0.49 under 1 sun of white illumination. The ultraviolet illuminated and etched devices were inferior, having voltages in the range of about 0.44 to 0.46. After illumination stress, all devices which had not been exposed to ultraviolet light showed an approximately 0.47 volts due to the Staebler-Wronski degradation effect. However, devices treated with the ultraviolet light illumination and etch steps, according to the method of the invention, actually demonstrated an improvement upon subsequent light soaking, to about 0.49 volts. These results demonstrate that the expected improvement in stability was due to the ultraviolet and etch treatment steps, in sequence, according to the method of the present invention.

While the present invention has been illustrated and described with reference to particular structures and methods of fabrication, it will be apparent to those skilled in the art that other changes and modifications can be made therein, within the scope of the present invention as defined by the appended claims.

I claim:

1. A method of producing a stabilized amorphous silicon film, comprising the steps of:
   (a) providing an amorphous silicon film deposited on to a substrate, the film having an exposed surface;
   (b) illuminating the film with an essentially blue or ultraviolet light to form a light damaged region and a region resistant to metastable degradation; and
   (c) etching the light damaged region to expose a portion of the region resistant to metastable degradation.

2. The method of claim 1 further comprising using the amorphous silicon film in an electronic, optoelectronic, or photovoltaic device.

3. The method of claim 1 wherein the light damaged region extends 700–10,000 Å below the film surface.

4. The method of claim 1 wherein etching comprises using a liquid etchant to remove 500–10,000 Å of the silicon film.

5. The method of claim 1 wherein etching comprises using a reactive hydrogen in a plasma or chemical vapor deposition reactor to remove 500–10,000 Å of the silicon film.

6. The method of claim 1 further comprising repeating the steps of illuminating and etching for a plurality of cycles.

7. The method of claim 1 wherein providing, illuminating, and etching are performed as steps in an amorphous silicon film deposition process.

8. The method of claim 3 wherein providing, illuminating, and etching are performed as steps in an amorphous silicon film deposition process.

9. The method of claim 6 wherein providing, illuminating, and etching are performed as steps in an amorphous silicon film deposition process.

10. The method of claim 1 wherein the amorphous silicon further comprises an alloy selected from the group consisting of a-SiGe:H and a-SiC:H.

11. The method of claim 3 wherein the amorphous silicon further comprises an alloy selected from the group consisting of a-SiGe:H and a-SiC:H.

12. The method of claim 6 wherein the amorphous silicon further comprises an alloy selected from the group consisting of a-SiGe:H and a-SiC:H.

13. The method of claim 1 wherein the amorphous silicon further comprises an alloy selected from the group consisting of a-SiGe:H and a-SiC:H.

14. The method of claim 1 wherein etching comprises using a liquid etchant to remove about 700 Å of the silicon film.

15. The method of claim 1 wherein etching comprises using a reactive hydrogen in a plasma or chemical vapor deposition reactor to remove about 700 Å of the silicon film.

* * * * *